United States Patent [19]

Lin

[11] Patent Number: 4,752,703
[45] Date of Patent: Jun. 21, 1988

[54] CURRENT SOURCE POLARITY SWITCHING CIRCUIT

[75] Inventor: Shyuh-Der Lin, Hsin-Chu, Taiwan

[73] Assignee: Industrial Technology Research Institute, Taiwan

[21] Appl. No.: 41,521

[22] Filed: Apr. 23, 1987

[51] Int. Cl.$^4$ .................. H03K 17/16; H03K 17/28; H03K 17/687; H03K 19/003

[52] U.S. Cl. .................. 307/572; 307/443; 307/263; 307/451; 307/585

[58] Field of Search .......... 307/263, 443, 542, 451, 307/452, 453, 270, 571, 572, 585, 290, 291; 323/312, 315

[56] References Cited

U.S. PATENT DOCUMENTS

| | | | |
|---|---|---|---|
| 3,140,408 | 7/1964 | May | 307/572 |
| 3,942,039 | 3/1976 | Kikuchi et al. | 307/572 |
| 4,115,740 | 9/1978 | Yoshida et al. | 307/572 X |
| 4,122,360 | 10/1978 | Kawagai et al. | |
| 4,323,796 | 4/1982 | Lathrope | 307/572 X |
| 4,567,378 | 1/1986 | Raver | 307/263 X |
| 4,578,600 | 3/1986 | Magee | |
| 4,622,482 | 11/1986 | Ganger | 307/263 X |
| 4,700,088 | 10/1987 | Tubbs | 307/443 X |

OTHER PUBLICATIONS

Koch et al., "A 12-Bit Sigma-Delta Analog-to-Digital Converter with a 15 MHz Clock Rate", IEEE Journal of Solid State Circuits, vol. SC-21, No. 6, pp. 1003-1009, Dec. 1986.

Primary Examiner—Stanley D. Miller
Assistant Examiner—David R. Bertelson
Attorney, Agent, or Firm—Cahill, Sutton & Thomas

[57] ABSTRACT

An analog current source polarity switching circuit composed of a pair of main P-channel and N-channel polarity switching transistors is supplemented by a dummy load switching circuit for connecting each current source transistor in the polarity switching circuit to a dummy load when the main polarity switching transistor is turned off and for disconnecting the dummy load when the main polarity switchng transistor is turned on. The dummy load switching circuit preferably employs a second pair of complementary P-channel and N-channel transistors controlled through an inverter from the input to the main polarity switching transistor circuit. MOSFET transistors are employed throughout the circuit.

4 Claims, 1 Drawing Sheet

CURRENT SOURCE POLARITY SWITCHING CIRCUIT

FIELD OF THE INVENTION

This invention relates to CMOS analog circuits, particularly those suited for use in integrated circuits.

BACKGROUND ART

Analog circuits such as those employed in analog-to-digital, digital-to-analog converters and in speech synthesizers make extensive use of current source polarity switching circuits. Such circuits, often called "current source polarity switches", are capable of producing constant current flow alternating in opposite directions. For example, when the input of the switch receives a control voltage at a certain level, its output will source a current to the load and when the input of the switch receives a control voltage at another level its output will sink constant current from the load.

Current source polarity switching circuits can be readily fabricated from transistors. The metal-oxide semiconductor field-effect transistors (MOSFETs) are widely used for large scale integrated circuits because of their low power consumptions and ease of manufacture. So called CMOS current source polarity switching circuits are those made up of opposite channel type metal-oxide semiconductors. Such circuits utilize two P-channel MOS transistors and two complementary N-channel MOS transistors with two of the transistors acting as current sources and two of the transistors acting as switches. One of the P-channel MOS transistors of the CMOS current source polarity switch circuit is used to supply source current to the output through the other P-channel MOS transistor which functions as a switch. And one of the N-channel MOS transistors of the CMOS current source polarity switch is used to supply sink current to the output through the other N-channel MOS transistor which also functions as a switch. A variable voltage control signal impressed on the input of the CMOS transistor switches causes one MOS transistor to turn on as the other MOS transistor is turned off and vice versa, depending on the voltage level at the input.

This CMOS current source switching circuit frequently is used in combination with other transistors which are employed to bias the amount of current in the sourcing and sinking transistors.

It has been observed that current source switch circuits of the type described above often do not produce a precise two level signal output. Rather, they produce an output signal which exhibits a current overshoot or "spike" from the transistor being turned on. Such spikes constitute extraneous signals or "noise" in the output signal and are very undesirable. Any increase in the noise to signal ratio of the polarity switching circuit adversely affects the quality of the integrated circuit embodying the circuit.

There has been a need, therefore, for improved circuitry to reduce the spike noise in current source polarity switching circuits.

DISCLOSURE OF THE INVENTION

This invention stems from the recognition that the spike at the output of a current source polarity switching circuit can be moderated and eliminated by connecting the current of each current source transistor to a dummy load when the current source transistor is disconnected from the working load by its polarity switching transistor. The complementary current source transistors are disconnected from the dummy load when they are connected to the working load at the output of the circuit to provide sourcing or sinking current, respectively.

Connecting and disconnecting the current source transistors to the dummy load is accomplished by a dummy load switching circuit including a pair of complementary switching transistors. The complementary switching transistors are connected to the P-channel and N-channel current source transistors respectively with the output of the complementary dummy load switching transistors connected to the dummy load. In the circuit embodying this invention, the inputs of the polarity switching transistors are connected to the input of a logic inverter and the inputs of the complementary dummy load switching transistors are connected to the output of the logic inverter, so that the control signal to the polarity switching transistors are the logical complement of the control signals to the complementary dummy load switching transistors. The logical state of the inverter will control the current flow in the working load and the dummy load. The circuitry is such that when the P-channel polarity switching transistor is turned off, the complementary P-channel dummy load switching transistor is turned on and the sourcing current from the sourcing current transistor will connect to the dummy load. When the P-channel polarity switching transistor is turned on, the complementary P-channel dummy load switching transistor is turned off. The same phenomenon applies to the sinking current portion of the circuit. And when the sourcing current flows through the P-channel polarity switching transistor to the working load, the sinking current will flow from the sinking current transistor through the complementary N-channel dummy load switching transistor to the summy load. By this arrangement both the sourcing current transistor and the sinking current transistor remain conducting during all times, either to the working load or to the dummy load. This effectively reduces spikes at the output of the current source switch circuit.

BRIEF DESCRIPTION OF THE DRAWING

The invention is described in greater detail hereinafter by reference to the accompanying drawings in which.

BEST MODE FOR CARRYING OUT THE INVENTION

Figure 1:
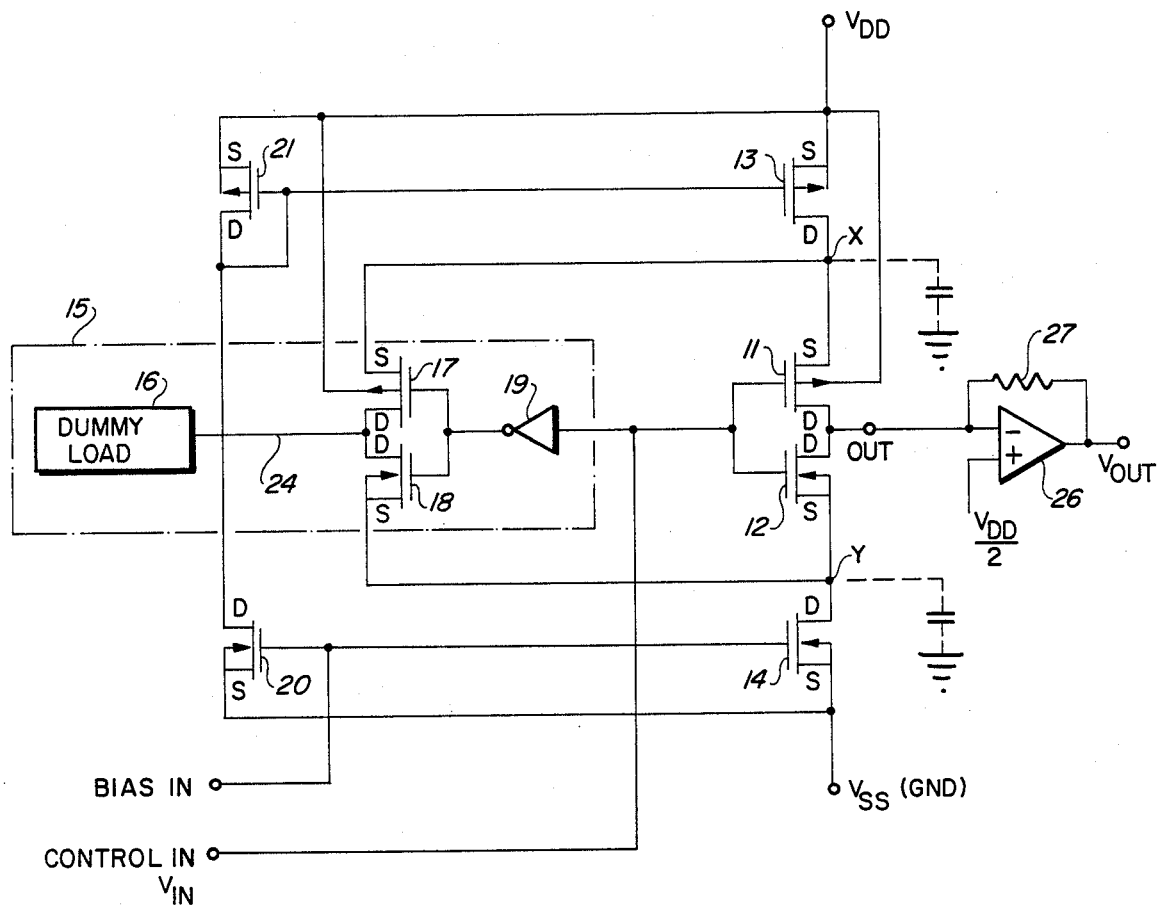
FIG. 1 is a schematic diagram of a current source polarity switching circuit embodying the invention.

The circuit of this invention is illustrated in the drawings and will be described by reference to a CMOS circuit made up of MOSFETs. It is to be understood, however, that the principles of the invention can be incorporated into circuits utilizing bipolar transistors, as well. Referring to the drawing, reference numerals 11, 12, 13, and 14 identify a set of MOS transistors in a conventional current source polarity circuit. Transistors 11 and 12 can be referred to as "polarity switching transistors", or "polarity switches". Transistor 11 is a P-channel type MOSFET having its source, or input electrode, connected to a current source transistor 13, another P-channel MOSFET. MOS transistor 12 is a N-channel type MOSFET having its source, or input electrode, connected to a second current source transistor 14. The drains, or output electrodes, of both polarity switching transistors 11 and 12 are connected to the output terminal (OUT) of the current source polarity switching circuit, which in turn is connected to a working load. The CMOS current source polarity switching circuit is completed by connection of the gates, or control electrodes, of transistors 11 and 12 to a control input terminal supplying a control voltage $V_{IN}$ to the circuit.

Currents in transistors 13 and 14 are both biased by the voltage applied at BIAS IN input through bias transistors 20,21. The operation of the circuit is as follows: When the input $V_{IN}$ to the inverter circuit is at low level, for example, 0 volts, transistor 12 is turned off and transistor 11 is turned on and sourcing current flows from $V_{DD}$ through transistors 13 and 11 to the output (OUT). When the input $V_{IN}$ to the inverter circuit is at a high level, for example, 5 volts, and beyond the threshold voltage of transistor 12, transistor 11 is turned off and transistor 12 is turned on and establishes a sinking current from the output (OUT) through transistors 12 and 14 to $V_{SS}$. This, then is the fundamental operating characteristic of a current source switching circuit; a low level voltage triggers a sourcing output current and a high level input voltage triggers an opposite sinking output current.

Although the CMOS circuit as described above has found widespread use in integrated circuits, it has been observed to exhibit an undesirable characteristic, namely, a higher than desired noise-to-signal ratio. The noise imparted to the output of the circuit is in the form of current spikes that appear on the output waveform when switching transistors 11 and 12 change state. Such spikes are thought to be due to large parastitic capacitances at nodes X and Y which can be explained as follows. When transistor 11 is turned off the voltage at node X will be pulled up to $V_{DD}$. At this moment, if a low voltage is applied at $V_{IN}$, there will be a current overshoot flowing to the working load (OUT) because the initial voltage is higher than the steady state voltage at node X. Similarly, the same phenomenon will occur for sinking current at node Y.

The moderation and elimination of spike noise in the circuit is realized by connecting nodes X and Y to a dummy load by means of a dummy load switching circuit 15. The complementary dummy load switching circuit 15 comprises a dummy load 16 and two switching transistors 17 and 18, with the dummy load being connected to the drains of the two transistors. MOS transistor 17 is a P-channel MOSFET with its source connected to polarity switching transistor 11 and current source transistor 13 at node X. MOS transistor 18 is a N-channel MOSFET with its source connected to polarity switching transistor 12 and current source transistor 20 at nody Y. In order to dissipate the noise spikes, transistor 17 must turn on when transistor 11 turns off and transistor 18 must turn on when transistor 12 turns off. To assure this sequence of operation the gate electrodes of the dummy load switching transistors 17 and 18 are connected to the logical complement of the control input signal $V_{IN}$. An inverter 19 is interposed between $V_{IN}$ and the gate electrodes of transistors 17 and 18 to provide this logical complement.

Thus, when a low level input signal $V_{IN}$ is supplied to the input to turn off transistor 12, a complementary signal goes to the complementary dummy load switching circuit 15 which turns on transistor 18, connecting node Y to the dummy load 16. Similarly, a high level input signal turning off transistor 11 will turn on dummy load switching transistor 17 to connect node X to the dummy load 16. In this manner the drains of transistors 13 and 14 are always connected to either the working load or the dummy load. The voltage at node X is never pulled up to $V_{DD}$ and the voltage at node Y is never pulled down to $V_{SS}$. Instead, the voltage at nodes X and Y are kept approximately at a constant leval even when transistors 11 and 12 are turned off or on. By this arrangement the current spike at the output is eliminated. Because there is no voltage level change at point X and Y, the capacitances at points X and Y have no effect on the propagation delay of the polarity switching circuit, and the operating frequency of the circuit can be increased significantly.

For most effective operation the voltage level of the dummy load, 16, should approximate the voltage at the working load which can be an operational amplifier 26 and resistor 27 as shown in FIG. 1. The working load is connected to the output (OUT) of the polarity switching circuit. The voltage produced in lead 24, which is connected to the drain electrode of transistors' 17 and 18, should be of the value of $V_{DD} - V_{SS}/2$. With $V_{SS}$ at ground that voltage becomes $V_{DD}/2$. Then, because both the voltages at the outputs of the main polarity switching transistors 11 and 12 and the complementary dummy load switching transistors 17 and 18 are $V_{DD}/2$, there is no difference in voltage levels at nodes X and Y whether the control in voltage, $V_{IN}$, is at high level or low level. This, in turn, substantially reduces the amplitude of current spikes at output (OUT).

Operation of the invention can be demonstrated in the form of voltage waveforms on the screen of an oscilloscope. Circuitry for connecting the scope to the output $V_{OUT}$ of operational amplifier load circuit is illustrated in FIG. 1. This circuitry includes an operational amplifier 26 having its inverting terminal connected to the output (OUT) of the current source polarity switching circuit. Amplifier 26 has a resistor 27 connected in parallel. A voltage of $V_{DD}/2$ is supplied to the non-inverting terminal of amplifier 26. In this circuitry the operational amplifier acts as a current to voltage converter and the waveforms shown in FIG. 2 can be produced on a scope.

Figure 2:
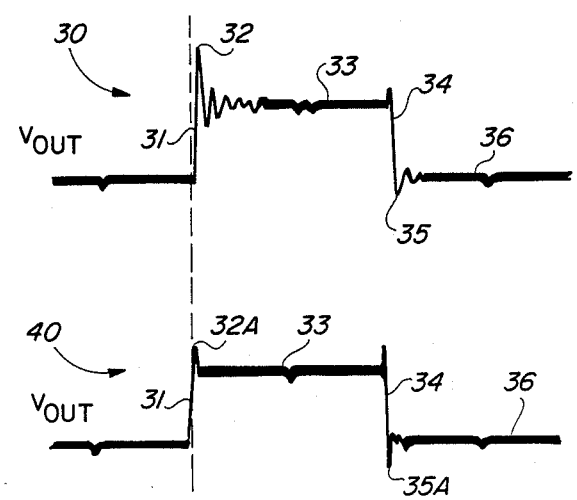
FIG. 2 is a diagram of waveforms which are useful in explaining the invention.

Waveform 30 of FIG. 2 shows the $V_{OUT}$ waveform that will be produced if the invention is not provided, i.e., if the switching circuit 15 is not provided in accordance with the present invention. If circuit 15 is absent, when transistor 11 is turned on, $V_{OUT}$ undergoes transition 31 and "overshoots" a considerable amount, for example, 2 volts, producing "spikes" 32 before settling at the level 33. Similarly, if transistor 12 turns on, $V_{OUT}$ undergoes transition 34 and overshoots, producing spikes 35 before settling at level 36. The noise spikes 32 and 35 can produce undesirable noise margin.

With circuit 15 in place and dummy load set at approximately $V_{DD}/2$ the waveform produced at the output of the circuit is that illustrated in FIG. 2 as waveform 40. It will be noted that the spikes 32A and 35A in waveform 40 are substantially less than the spikes 32 and 35 of waveform 30.

In some cases the working load can be an operational amplifier in parallel with a capacitor which acts as an integrator, or the working load can be other circuitry. No matter what kind of the working load, the circuit will perform satisfactorily as long as the voltage at the output of complementary dummy load switching circuit matches that at the output of the main polarity switching circuit. This may, but not necessarily, equal $V_{DD}/2$.

What is claimed is:

1. In an analog circuit a sourcing current transistor and a sinking current transistor connected, respectively, to two different level power sources, a complementary pair of polarity switching transistors respectively connecting said sourcing current transistor and said sinking current transistor to a working load, the control electrodes of said pair of complementary polarity switching transistors being connected to a variable level input signal whereby said polarity switching transistors are alternately turned on and off, a dummy load, a pair of complementary dummy load switching transistors, each of said dummy load switching transistors being connected to different ones of said sourcing current transistor and said sinking current transistor, and an inverter connecting the control electrodes of said dummy load switching transistors to said input signal.

2. The analog circuit of claim 1 wherein said sourcing current transistor and said sinking current transistor are a complementary pair of N-channel type and P-channel type MOS transistors, said polarity switching transistors are a complementary pair of N-channel type and P-channel type MOS transistors and said dummy load switching transistors are a complementary pair of N-channel type and P-channel type MOS transistors.

3. The analog circuit of claim 1 wherein the voltage level of said dummy load is maintained at the same voltage level as said working load.

4. The analog circuit of claim 2 wherein the voltage level of said dummy load is maintained at the same voltage level as said working load.

* * * * *